(12) United States Patent
Amakusa

(10) Patent No.: US 7,481,099 B2
(45) Date of Patent: Jan. 27, 2009

(54) MICROMOTION DEVICE AND SCANNING PROBE MICROSCOPE

(75) Inventor: Takaaki Amakusa, Tokyo (JP)

(73) Assignee: JEOL Ltd., Tokyo (JP)

( * ) Notice: Subject to any disclaimer, the term of this patent is extended or adjusted under 35 U.S.C. 154(b) by 135 days.

(21) Appl. No.: 11/640,832

(22) Filed: Dec. 18, 2006

(65) Prior Publication Data

US 2007/0157712 A1    Jul. 12, 2007

(30) Foreign Application Priority Data

Dec. 19, 2005    (JP) ............................. 2005-364881

(51) Int. Cl.
  *G01N 13/10*  (2006.01)
  *G12B 21/22*  (2006.01)
  *H01L 41/053* (2006.01)
  *B81B 5/00*   (2006.01)

(52) U.S. Cl. ...................................................... 73/105

(58) Field of Classification Search ................... 73/105; 250/306; 310/346
See application file for complete search history.

(56) References Cited

FOREIGN PATENT DOCUMENTS

JP    7-287022    10/1995

*Primary Examiner*—Daniel S Larkin
(74) *Attorney, Agent, or Firm*—The Webb Law Firm

(57) ABSTRACT

A tubular piezoelectric device which is cylindrically shaped and has cutouts in one end portion. The one end portion of the piezoelectric device is mounted to a mount stage made of a material that has a different coefficient of thermal expansion from the material of the piezoelectric device. Electrodes are mounted on the piezoelectric body. The micromotion device produces micromotions of the other end portion of the piezoelectric body. The cutouts produce elastic deformation which absorbs differences in the amount of deformation between the piezoelectric body and the mount stage caused by temperature variations.

7 Claims, 3 Drawing Sheets

PRIOR ART

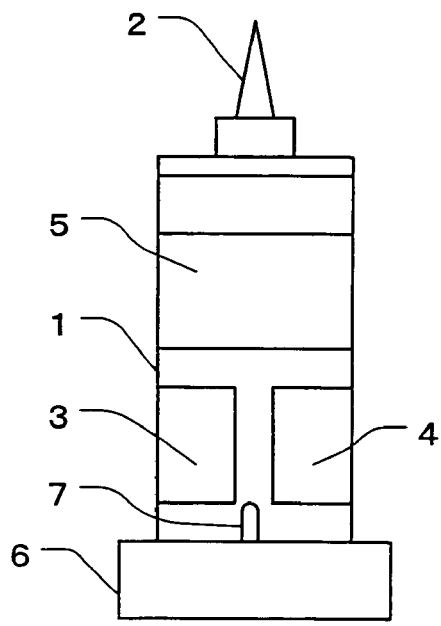
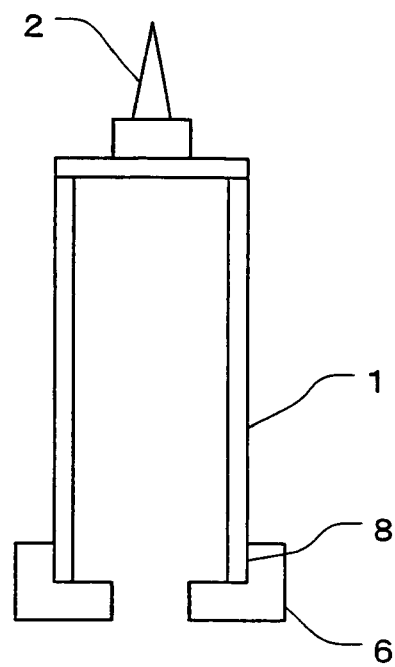
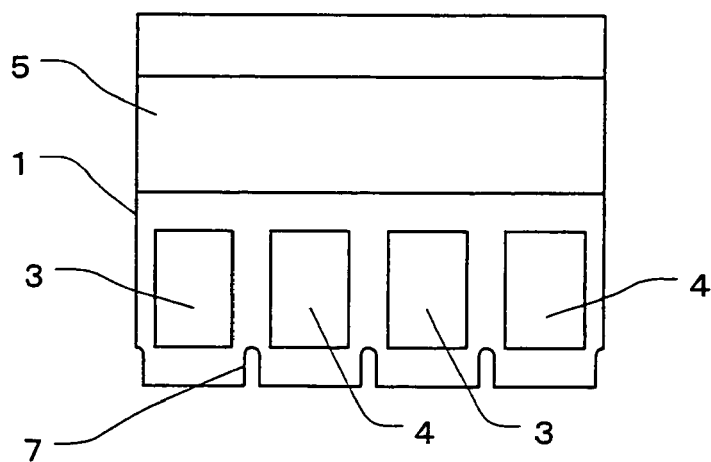

MICROMOTION DEVICE AND SCANNING PROBE MICROSCOPE

BACKGROUND OF THE INVENTION

1. Field of the Invention

The present invention relates to a micromotion device using a piezoelectric device. The invention also relates to a scanning probe microscope that is a general term for a family of instruments including scanning tunneling microscope, atomic force microscope, magnetic force microscope, friction force microscope, viscoelasticity microscope (VE-AFM), scanning Kelvin probe microscope (SKPM), scanning near field microscope, and other similar instruments.

2. Description of Related Art

In recent years, a scanning probe microscope for obtaining a topographical image, magnetic image, or spectroscopic image of a surface of a sample has attracted attention. In particular, the microscope has a cantilever equipped with a probe. The cantilever is placed opposite to the sample. The distance between the probe and sample is set to nanometers or less. The probe is scanned over the sample surface to measure a physical quantity, such as an interatomic force, magnetic force, or electrostatic force exerted between the probe and sample. The topographical image, magnetic image, or spectroscopic image is derived based on the result of the measurement.

To scan the probe relative to the sample surface, a scanner that is a micromotion device as shown in FIG. 1 is used. In FIG. 1, a mount stage 6 is fitted to an instrument (not shown). One end of a cylindrical or tubular piezoelectric device 1 (also known as a piezo tube) is mounted to the mount stage 6. A probe 2 is installed at the other, free end. FIG. 2 is a cross-sectional view of the micromotion device shown in FIG. 1. In FIG. 2, the mount stage 6 and the piezo tube 1 are held together in a mount portion 8. The stage and piezo tube may also be held together with screws. In scanning probe microscopy requiring atomic resolution, even a low level of rattling is not tolerated. Consequently, they are held together chiefly with adhesive.

The free end of the piezo tube 1 is displaced by deformation caused by a distortion utilizing elongation or contraction of the piezoelectric device under electrodes 3 and 4. The elongation or contraction is produced by applying a voltage to the electrodes 3 and 4. Therefore, large stress is induced in the mount portion 8.

Furthermore, in the case of a scanning probe microscope equipped with an ultra-high vacuum sample chamber, a bakeout is performed to remove gases adhering to the inside of the sample chamber to obtain an ultra-high vacuum environment in the sample chamber where a scanner is installed. In particular, a heating cycle consisting of heating the chamber to a bakeout temperature of about 150° C. from room temperature and returning the temperature from the bakeout temperature to room temperature takes place. The piezo tube 1 has a small coefficient of thermal expansion and is hard and brittle. The metal material of the mount stage 6 has a coefficient of expansion larger than that of the piezoelectric device. Therefore, during the heating cycle, the mount stage 6 varies more greatly than the piezo tube 1. Furthermore, the adhesive that can be used in an ultra-high vacuum environment where little gas is produced shows a small coefficient of thermal expansion after curing and hardly deforms. Hence, the piezo tube 1, adhesive, and the mount stage 6 made of the metal have different coefficients of thermal expansion. As a result, the piezo tube 1 is damaged or the adhesive peels off from the mount portion 8.

Where an observation is made under ultra-high vacuum, low-temperature conditions, the temperature is lowered to the temperature of liquid nitrogen or liquid helium by the refrigerant after the bakeout and, therefore, the components differ more widely in coefficient of thermal expansion. In consequence, if a heating cycle of room temperature-bakeout temperature-room temperature-low temperature-room temperature is performed, the mount portion 8 is more likely to be damaged.

To solve this problem, a prior art technique consisting of inserting a buffer ceramic part between the piezo tube and the metal mount stage has been proposed. However, the buffer ceramic part has a coefficient of thermal expansion close to that of the piezo tube. Consequently, there is the problem that the adhesive peels off between the buffer part and the metal mount stage.

One prior art technique is a micromotion device for driving a microscope probe (see, for example, Japanese patent laid-open No. H7-287022). The micromotion device is made of a cylindrical piezoelectric ceramic device provided with cutouts to prevent electromagnetically induced noise and electrical current interference.

The issue addressed by the present invention is that the piezo tube is damaged due to a difference in thermal deformation between the piezo tube and the mount stage during the heating cycle occurring in the scanning probe microscope or other similar instrument.

SUMMARY OF THE INVENTION

A first embodiment of the present invention is a micromotion device for producing micromotions of a first end portion of a cylindrically-shaped piezoelectric body having at least one cutout in its second end portion located on the opposite side of the first end portion. The micromotion device comprises the piezoelectric body, a mount stage for holding the second end portion of the piezoelectric body, and electrodes mounted on the piezoelectric body. The piezoelectric body and the mount stage have different coefficients of thermal expansion. Differences in the amount of deformation between the piezoelectric body and the mount stage due to temperature variations are absorbed by elastic deformation of the piezoelectric body produced by the formation of the cutout.

A micromotion device according to a second embodiment of the present invention is based on the first embodiment and further characterized in that the cutout has a curved front-end portion.

A micromotion device according to a third embodiment of the present invention is based on the first embodiment and further characterized in that the cutout assumes a U-shaped form.

A micromotion device according to a fourth embodiment of the present invention is based on any one of the first through third embodiments and further characterized in that the at least one cutout is at least two in number and formed at different positions.

A micromotion device according to a fifth embodiment of the present invention is based on any one of the first through third embodiments and further characterized in that the at least one cutout is four in number and equally spaced from each other.

A micromotion device according to a sixth embodiment of the present invention is based on any one of the first through fifth embodiments and further characterized in that the piezoelectric body is bonded to the mount stage with adhesive.

A seventh embodiment of the present invention is a scanning probe microscope having a probe disposed opposite and close to a sample, the microscope being adapted to obtain image information about a surface of the sample based on a signal detected by a physical quantity acting between the probe and the sample by varying a relative position between the probe and the sample. The sample is placed in a sample chamber whose temperature is varied. The relative position between the probe and sample is varied by a micromotion device according to any one of the first through sixth embodiments.

In the present invention, at least one cutout is formed in the fixed end of the tubular piezoelectric device. The fixed end of the tubular piezoelectric device easily complies with thermal expansion and shrinkage of the mount stage, thus preventing damage to the piezoelectric device.

Other objects and features of the invention will appear in the course of the description thereof, which follows.

BRIEF DESCRIPTION OF THE DRAWINGS

FIG. 4 is a side elevation of a micromotion device according to an embodiment of the present invention;

FIG. 5 is a cross-sectional view of the device shown in FIG. 4;

FIG. 6 is an expanded view of the piezoelectric device shown in FIG. 5;

DESCRIPTION OF THE PREFERRED EMBODIMENTS

First Embodiment

Figure 1:
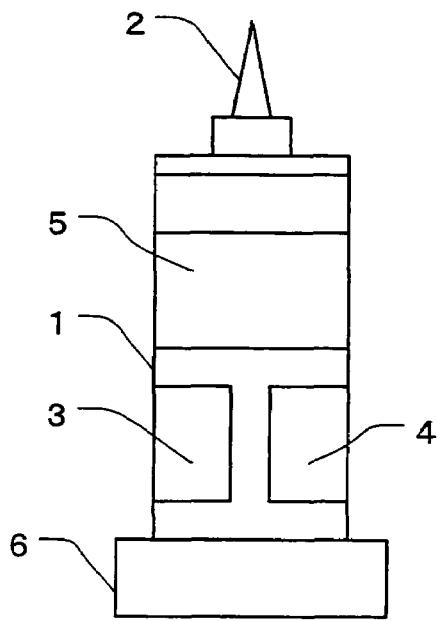
FIG. 1 is a cross-sectional view of a prior art micromotion device.
Figure 2:
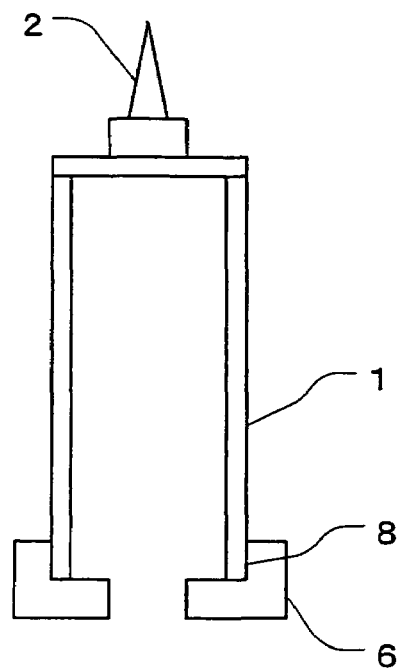
FIG. 2 is a cross-sectional view of the device shown in FIG. 1.
Figure 3:
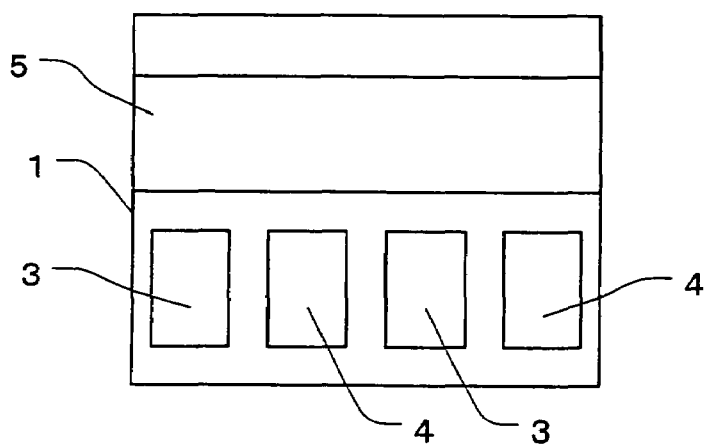
FIG. 3 is an expanded view of the piezoelectric device shown in FIG. 1.

A configuration according to an embodiment of the present invention is described by referring to FIG. 4. A mount stage 6 made of a metal, such as stainless steel, is installed in an apparatus (not shown). One end of a cylindrical or tubular piezoelectric device (also referred to as a piezo tube) 1 is mounted to the mount stage 6. In scanning probe microscopy requiring atomic resolutions, even a low level of rattling is not tolerated. Therefore, the piezo tube 1 is bonded to the stage 6 with adhesive. The piezo tube 1 is made of a sheet of piezoelectric ceramic, such as $PbZrTiO_3$, and radially polarized. The tube is not polarized longitudinally.

Two X-drive electrodes 3 and two Y-drive electrodes 4 are alternately arranged and regularly spaced from each other on the outer surface of the piezo tube 1. The electrodes 3 and 4 are metallized. A Z-drive electrode 5 is metallized at the free end of the tube. Conductor wires (not shown) are connected with the electrodes 3, 4, and 5. A voltage is applied to each electrode. An electrode (not shown) is metallized on the inside of the piezo tube 1 and acts as a grounding electrode.

The mount stage 6 has portions located between the X-drive electrodes 3 and Y-drive electrodes 4. Four U-shaped cutouts 7 are formed in these portions of the piezo tube 1 between the electrodes 3 and 4 and regularly spaced from each other. Each of the cutouts 7 has a curved front-end portion. A probe 2 is installed at the other, free end of the piezo tube 1. FIG. 5 is a cross-sectional view of the structure shown in FIG. 4. FIG. 6 is an expanded view of the piezo tube 1 of FIG. 4.

The structures of the various portions shown in FIG. 4 have been described so far. The operation is next described. In the piezo tube 1, the free end at which the probe 2 is installed is displaced in the X-, Y-, and Z-directions using deformation caused by distortion by making use of elongation and contraction of the piezoelectric device under the electrodes. The elongation and contraction are induced by applying a voltage to each of the electrodes 3, 4, and 5. Therefore, the mount portion 8 is highly stressed.

In the case of a scanning probe microscope equipped with an ultra-high vacuum sample chamber, a bakeout is performed to remove gases adhering to the inside of the sample chamber to obtain an ultra-high vacuum environment in the sample chamber where a scanner is installed. In particular, a heating cycle consisting of heating the chamber to a bakeout temperature of about 150° C. from room temperature and returning the temperature from the bakeout temperature to room temperature takes place. The piezo tube 1 has a small coefficient of thermal expansion and is hard and brittle. The metal material of the mount stage 6 has a coefficient of thermal expansion larger than that of the piezoelectric device. Therefore, during the heating cycle, the mount stage 6 varies (expands) more greatly than the piezo tube 1. Furthermore, the adhesive that can be used in an ultra-high vacuum environment where little gas is produced shows a small coefficient of thermal expansion after curing and hardly deforms. Hence, the piezo tube 1, adhesive, and the mount stage 6 made of the metal have different coefficients of thermal expansion.

Where an observation is made under ultra-high vacuum, low-temperature conditions, the temperature is lowered to the temperature of liquid nitrogen or liquid helium by the refrigerant after the bakeout and, therefore, the components differ more widely in terms of thermal contraction. In consequence, if a heating cycle of room temperature-bakeout temperature-room temperature-low temperature-room temperature is performed, they will become more different in terms of thermal deformation.

However, the mount portion 8 of the piezo tube is provided with the U-shaped cutouts 7 and so if the mount stage made of a metal is deformed by thermal expansion or contraction, the piezo tube 1 easily complies with the deformation by inducing an elastic deformation. Therefore, it is less likely that the piezo tube 1 is damaged or the adhesive peels off. Especially, in an ultra-high-vacuum, temperature-variable scanning probe microscope, there is a heating cycle consisting of room temperature-bakeout temperature-room temperature-low temperature-room temperature. The mount stage 6 deforms greatly. Since the mount portion 8 of the piezo tube 1 readily complies with the deformation, damage is unlikely to occur. This gives rise to especially effective results.

If the number of the cutouts 7 is too large, the strength of the piezo tube 1 deteriorates. Where the four U-shaped cutouts 7 are formed, sufficient strength is retained. When a voltage is applied to the piezo tube 1, the portions of the tube 1 which are under the electrodes 3 and 4 are deformed. Because the cutouts 7 are arranged between the electrodes 3 and 4, the effect of distortion can be suppressed to a minimum.

Figure 8:
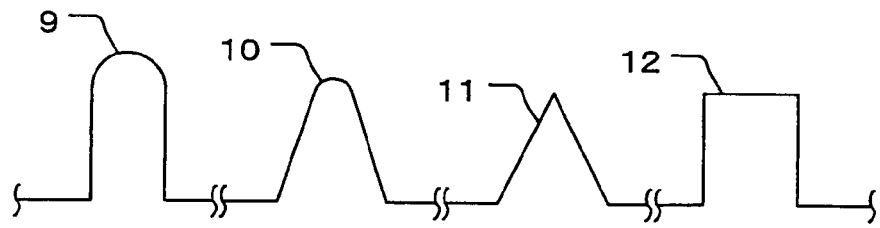
FIG. 8 is a view illustrating cutouts used in the present invention.

Of course, the shape of each cutout is not limited to the U-shaped form. Preferably, the front end, that is, the end remote from the stage, is shaped as a curved surface to suppress stress concentration in a case where the piezo tube is thermally deformed. In FIG. 8, in a case where the cutout assumes a U-shaped form 9 or the front end assumes a curved form 10, cracking is less likely to occur than where the front end assumes a V-shaped form 11 or rectangle-shaped form 12. Furthermore, the number of the cutouts is not limited to four. It suffices that there is at least one cutout. Where the number of the cutouts is two or more, the mount portion of the piezo tube is divided into two or more pieces. Therefore, it is easier to follow variations in the mount stage, resulting in improved effectiveness. However, if there are too many cutouts, the strength of the piezo tube deteriorates with undesirable results.

While the operation has been described so far, when the temperature varies, the portions of the piezo tube which are located around the cutouts are made to more easily accommodate thermal expansion and contraction of the mount stage in accordance with the present invention. Therefore, there arises the advantage that the piezo tube is less likely to be damaged. Especially, where two or more cutouts are formed, greater advantage can be obtained. Where the front-end portion of each cutout is a curved surface, such as a rectangle-shaped form, the cutout is less prone to cracking than where the cutout is a V-shaped or rectangle-shaped form.

Figure 9:
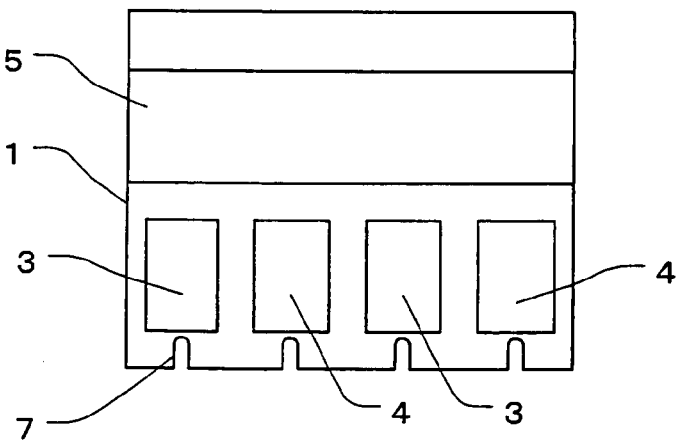
FIG. 9 is an expanded view of a piezoelectric device according to a further embodiment of the present invention.

It is to be understood that the present invention is not limited to the above embodiment but rather various changes and modifications are possible. For example, as shown in FIG. 9, the cutouts may be arranged under the electrodes.

Second Embodiment

A scanning tunneling microscope makes use of the principle of a so-called tunneling effect. That is, the distance between a sample and a metal probe is kept to less than 1 nm. A bias voltage of about several volts is applied between the sample and probe. As a result, electrons move across the vacuum gap between the probe and sample, producing a tunneling current. The tunneling current is sensitive to the distance between the sample and the probe and varies exponentially with the distance. Accordingly, using the micromotion device employing a piezoelectric device, the position of the probe or sample is controlled in the Z-direction such that the tunneling current is kept constant, and the surface of the sample is scanned in two dimensions. Topography of the sample surface is imaged as a topographic image based on data obtained by converting the voltage applied for the control in the Z-direction into a distance. Thus, the topography of the sample surface can be observed at the atomic level.

Figure 7:
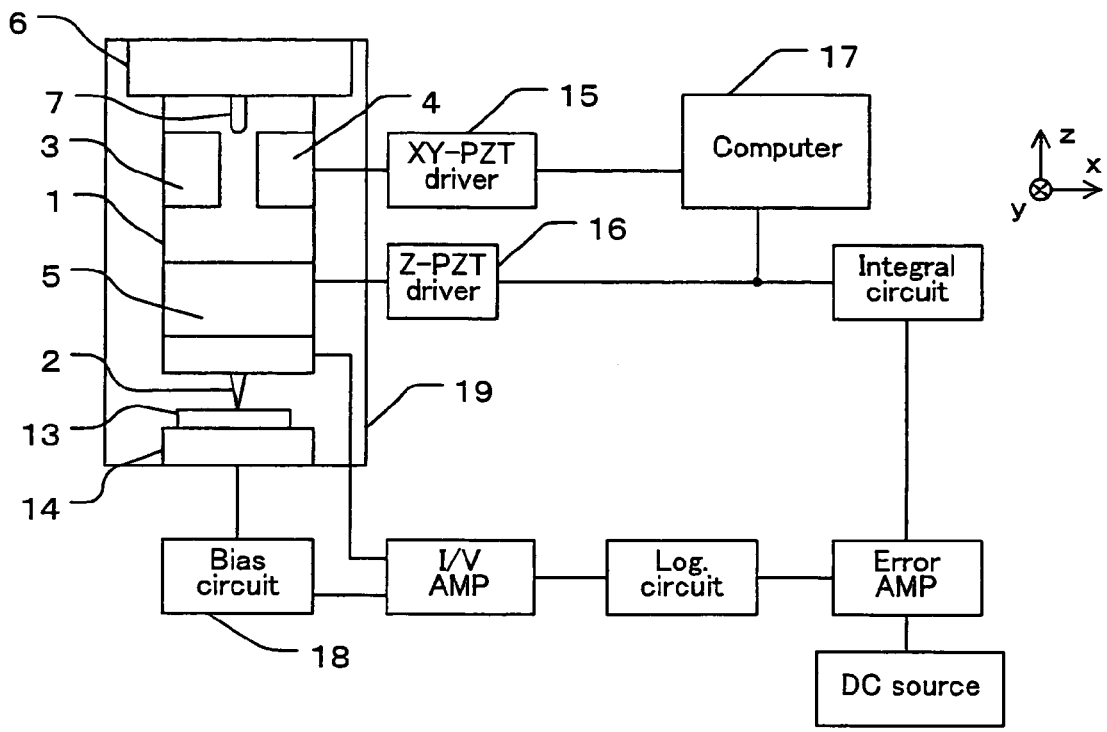
FIG. 7 is a block diagram of a scanning probe microscope according to another embodiment of the present invention.

FIG. 7 shows a scanning tunneling microscope equipped with a scanner that is a micromotion device according to an embodiment of the present invention. The sample observational portion of this microscope is accommodated in an ultra-high vacuum sample chamber 19 having a vacuum pump (not shown). The temperature of the sample chamber 19 can be varied by a temperature controller (not shown) consisting of a heater and a liquid nitrogen cooling device or the like. A sample 13 is placed on a sample stage 14. A probe 2 is placed opposite and close to the sample 13. The probe 2 is installed at the free end of a tubular piezoelectric device (piezo tube) 1. The fixed end of the piezo tube 1 is held to a sample chamber 19 via a mount stage 6. Electrodes 3, 4, and 5 for X-, Y-, and Z-axes, respectively, are metallized on the surface of the piezoelectric device 1. Voltages are applied to the electrodes to displace the free end in the X-, Y-, and Z-directions utilizing a piezoelectric effect.

An XY driver 15 that is a drive-and-control circuit is connected with the X-drive electrode 3 and Y-drive electrode 4 of the tubular piezoelectric device 1. A Z driver 16 that is another drive-and-control circuit is connected with the Z-drive electrode 5. The XY driver 15 and Z driver 16 are connected with a computer 17, which is composed of an arithmetic portion, a memory, and a display device (none of which are shown) and controls the drivers.

The computer 17 controls a bias circuit 18 and a tunneling current-detecting circuit for detecting the tunneling current flowing between the probe 2 and the sample 13. The bias circuit 18 applies a given bias voltage between the probe 2 and sample 13.

The position of the probe 2 is controlled in the Z-direction by the micromotion device using the tubular piezoelectric device 1 to scan the surface of the sample 13 in two dimensions such that the tunneling current is kept constant. Topographic information is obtained based on data derived by converting the voltage applied for the control in the Z-direction into a distance by the computer 17. In this way, the surface is imaged.

In the scanning probe microscope of the construction described so far, if a heating cycle of room temperature-bakeout temperature-room temperature-low temperature-room temperature occurs as already described in the first embodiment, the mount stage 6 made of a metal deforms greatly. The mount portion of the tubular piezoelectric device 1 having the cutouts 7 easily accommodates the deformation and so damage is effectively prevented.

It is to be understood that the present invention is not limited to the above-described embodiments but rather various changes and modifications are possible. For example, the sample may be scanned. In addition, the invention may be applied to a scanning probe microscope that is a general term for a family of instruments including atomic force microscope, magnetic force microscope, friction force microscope, viscoelasticity microscope (VE-AFM), scanning Kelvin probe microscope (SKPM), scanning near field microscope, and other similar instruments.

Having thus described my invention with the detail and particularity required by the Patent Laws, what is desired protected by Letters Patent is set forth in the following claims.

The invention claimed is:

1. A micromotion device comprising:
a cylindrically-shaped piezoelectric body having first and second end portions located on opposite sides;
at least one cutout formed in said first end portion;
a mount stage for holding said first end portion of the piezoelectric body, the mount stage having a different coefficient of thermal expansion from said piezoelectric body; and
electrodes mounted on said piezoelectric body,
wherein said second end portion of the piezoelectric body is induced to produce micromotions, and
wherein differences in an amount of deformation between the piezoelectric body and the mount stage due to temperature variations are absorbed by elastic deformation of the piezoelectric body produced by formation of said at least one cutout.

2. A micromotion device as set forth in claim 1, wherein said at least one cutout has a curved front-end portion.

3. A micromotion device as set forth in claim 1, wherein said at least one cutout assumes a U-shaped form.

4. A micromotion device as set forth in any one of claims 1 to 3, wherein said at least one cutout is at least two in number and formed at different positions.

5. A micromotion device as set forth in any one of claims 1 to 3, wherein said at least one cutout is four in number and equally spaced from each other.

6. A micromotion device as set forth in any one of claims 1 to 3, wherein said piezoelectric body is bonded to said mount stage with adhesive.

7. A scanning probe microscope having a probe disposed opposite and close to a sample, the microscope being adapted to obtain image information about a surface of the sample based on a signal detected by a physical quantity acting between the probe and the sample by varying a relative position between the probe and the sample;

said probe supported by a micromotion device comprising:
a cylindrically-shaped piezoelectric body having first and second end portions located on opposite sides;
at least one cutout formed in said first end portion;
a mount stage for holding said first end portion of the piezoelectric body, the mount stage having a different coefficient of thermal expansion from said piezoelectric body; and
electrodes mounted on said piezoelectric body, wherein said second end portion of the piezoelectric body is induced to produce micromotions, wherein differences in an amount of deformation between the piezoelectric body and the mount stage due to temperature variations are absorbed by elastic deformation of the piezoelectric body produced by formation of said at least one cutout, wherein said sample is placed in a sample chamber whose temperature is varied, and wherein the relative position between the probe and sample is varied by said micromotion device.

* * * * *